United States Patent
Scott et al.

(10) Patent No.: US 12,431,907 B1
(45) Date of Patent: Sep. 30, 2025

(54) DUTY-CYCLE MATCHED DIFFERENTIAL CLOCK DIVIDER CIRCUIT

(71) Applicant: Synopsys, Inc., Sunnyvale, CA (US)

(72) Inventors: Ryan Anthony Scott, Fenwick (CA); James Lin, Richmond Hill (CA)

(73) Assignee: Synopsys, Inc., Sunnyvale, CA (US)

( * ) Notice: Subject to any disclaimer, the term of this patent is extended or adjusted under 35 U.S.C. 154(b) by 55 days.

(21) Appl. No.: 18/329,815

(22) Filed: Jun. 6, 2023

(51) Int. Cl.
*H03K 21/02* (2006.01)
*H03K 3/037* (2006.01)

(52) U.S. Cl.
CPC ......... *H03K 21/023* (2013.01); *H03K 3/0372* (2013.01); *H03K 21/026* (2013.01)

(58) Field of Classification Search
CPC ... H03K 21/023; H03K 3/0372; H03K 21/026
See application file for complete search history.

(56) References Cited

U.S. PATENT DOCUMENTS

| | | | | |
|---|---|---|---|---|
| 9,166,571 | B2* | 10/2015 | Connell | H03K 3/356104 |
| 2021/0126628 | A1* | 4/2021 | Hong | H03K 3/0372 |

* cited by examiner

*Primary Examiner* — Lincoln D Donovan
*Assistant Examiner* — James G Yeaman
(74) *Attorney, Agent, or Firm* — Fenwick & West LLP

(57) ABSTRACT

Embodiments relate to a system and method of generating a duty-cycle matched differential clock divider circuit. The duty-cycle matched differential clock divider circuit may include a primary latch, differential latch, and a first inverter. The primary latch may be coupled to receive a feedback signal and complementary input clock signals. The primary latch may be configured to produce a first output signal. The differential latch may be coupled to receive the first output signal produced by the primary latch and the complementary input clock signals. The differential latch may be configured to produce a second output signal and a third output signal. The first inverter may be coupled to receive the second output signal produced by the differential latch, and may be configured to produce the feedback signal applied to an input of the primary latch.

12 Claims, 6 Drawing Sheets

DUTY-CYCLE MATCHED DIFFERENTIAL CLOCK DIVIDER CIRCUIT

TECHNICAL FIELD

The present disclosure relates to an electronic circuit, more specifically to a duty-cycle matched differential clock divider circuit.

BACKGROUND

High-speed circuits may use differential clock signals as they are less susceptible to interference and can operate from lower voltages. Strict duty-cycle distortion and skew requirements, however, are enforced on the differential clock paths for maintaining high-performance downstream. The degradation of circuit performance may worsen the noise rejection of differential signals, reduce setup time margin of circuits running on differential clocks, and worsen the linearity performance of the circuits, such as phase interpolators. Some methods require the tuning of analog device sizes to obtain optimal performance and matching of duty cycle and skew for frequency dividers. One method of correcting differential clock skew after frequency division includes using cross-coupled inverters. This method, however, introduces duty-cycle distortion.

SUMMARY

Embodiments relate to a system and method of generating a duty-cycle matched differential clock divider circuit. The differential clock divider circuit may be implemented on a computer system. The differential clock divider circuit may include a primary latch, differential latch, and a first inverter. The primary latch may be coupled to receive a feedback signal and complementary input clock signals. The primary latch may be configured to produce a first output signal. The differential latch may be coupled to receive the first output signal produced by the primary latch and the complementary input clock signals. The differential latch may be configured to produce a second output signal and a third output signal. The first inverter may be coupled to receive the second output signal produced by the differential latch and may be configured to produce the feedback signal applied to an input of the primary latch. The differential clock divider circuit may further include a second inverter and a third inverter. The second inverter may be coupled to receive the second output signal from the differential latch, to produce a first differential frequency divided clock signal. The third inverter may be coupled to receive the third output signal from the differential latch, to produce a second differential frequency divided clock signal.

The primary latch may include a first transmission gate and a feedback loop. The first transmission gate may be coupled to receive the feedback signal and the complementary input clock signals. The state of a transmission gate is determined by logic level values of the complementary input clock signals. The feedback loop may include a fourth inverter, a fifth inverter, and a second transmission gate. The fourth inverter may be coupled to receive an output of the first transmission gate and produce the first output signal. The fifth inverter may be coupled to receive the first output signal and produce an inverted first output signal. The second transmission gate may be coupled to receive the inverted first output signal, and the output of the second transmission gate may be coupled to the output of the first transmission gate and the input of the fourth inverter. The feedback loop may be configured to store a logic level value.

The differential latch may include a sixth inverter, a first and second feed-forward transmission gates, and a set of two transmission gate and inverter pairs. The sixth inverter may be coupled to receive the first output signal and produce a fourth output signal. The first feed-forward transmission gate may be coupled to receive the fourth output signal produced by the sixth inverter, while the second feed-forward transmission gate may be coupled to receive the first output signal produced by the primary latch. The set of two transmission gate and inverter pairs may include a first and second transmission gate and inverter pair. Each pair may include a transmission gate coupled to receive an output of the inverter in the pair. The set of two transmission gate and inverter pairs may be configured to store a logic level value.

In some embodiments, the differential clock divider circuit may be implemented with D-type flip flops. The differential clock divider circuit may include a first flip flop, a first inverter, a second inverter, and a second flip flop. The first flip flop may be coupled to receive a feedback signal and complementary clock signals and produces a first output signal. The first inverter is coupled to receive the first output signal produced by the first flip flop and produces the feedback signal applied to an input of the first flip flop. The second inverter is coupled to receive the feedback signal and produces a second output signal. The second flip flop is coupled to receive the second output signal and the complementary clock signals and produces a third output signal. The third inverter is coupled to receive the first output signal produced by the first flip flop, the first inverter producing a first differential frequency divided clock signal. The fourth inverter is coupled to receive the third output signal and produces a second differential frequency divided clock signal. The first and second flip flops may be edge-triggered flip flops.

In some embodiments, the differential clock divider circuit may be scaled to perform higher divisions. The differential clock divider circuit may include a first flip flop, a first inverter, one or more flip flops coupled in a cascading chain, a second inverter, and a second flip flop. The first flip flop may be coupled to receive a divided signal and complementary clock signals and produces a first output signal. The first inverter may be coupled to receive the first output signal produced by the first flip flop and produces a feedback signal. The one or more flip flops may include a starting flip flop, intermediate flip flops, and a last flip flop. The starting flip flop may be coupled to receive the feedback signal, and each intermediate flip flop may be coupled to receive the output of a preceding flip flop. Each of the one or more flip flops may be coupled to receive a reset signal. The output of a last flip flop in the chain may produce the divided signal, which may be coupled to an input of the first flip flop. The second inverter may be coupled to receive the divided signal and produces a second output signal. The second flip flop may be coupled to receive the second output signal and the complementary clock signals and produces a third output signal. The differential clock divider circuit may further include a third inverter and a fourth inverter. The third inverter may be coupled to receive the first output signal produced by the first flip flop and produces a first differential frequency divided clock signal. The fourth inverter, coupled to receive the third output signal produced by the second flip flop, and produces a second differential frequency divided clock signal.

Figure 1:
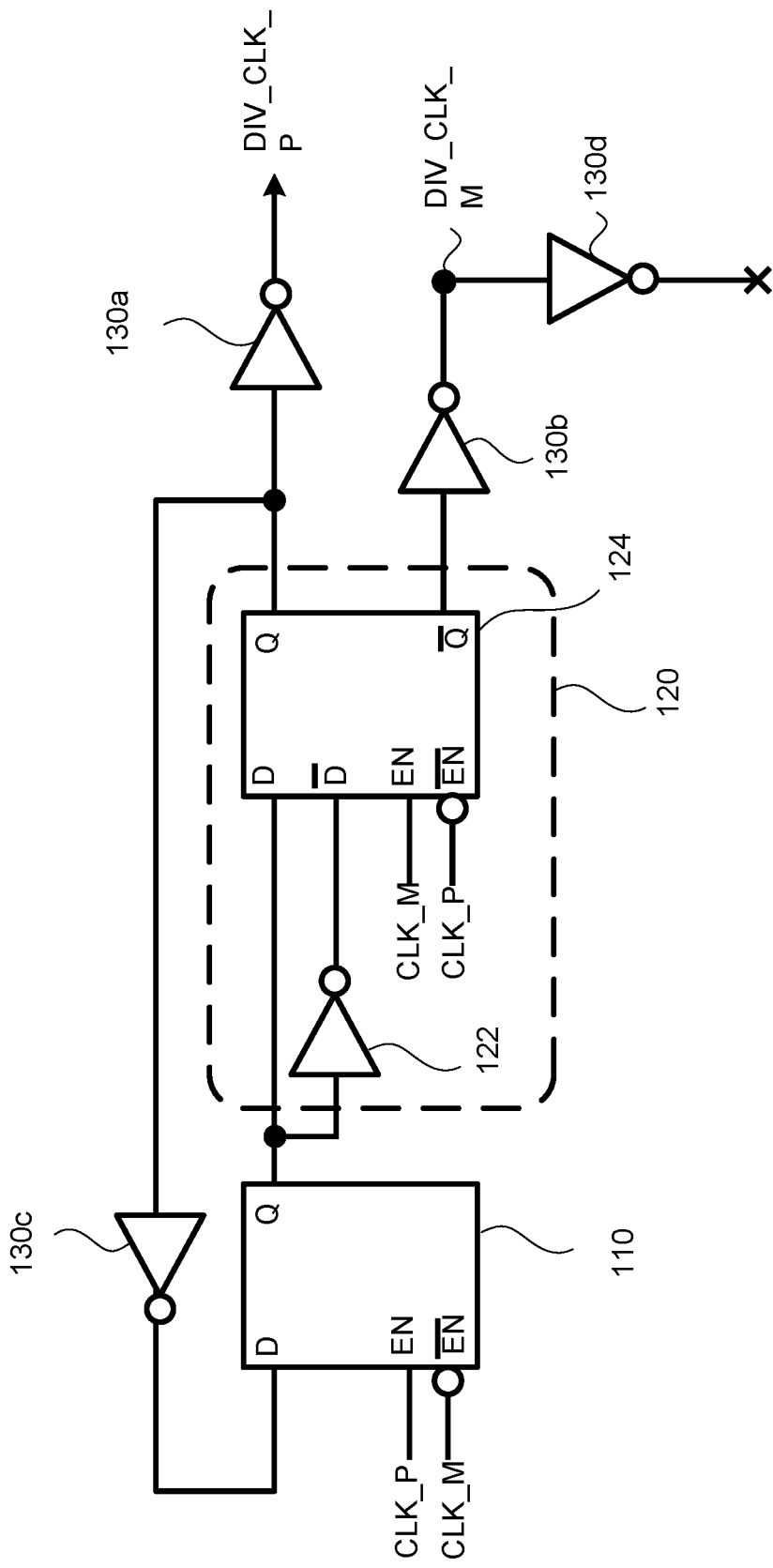
FIG. 1 is a top-level circuit block diagram illustrating a first embodiment of a duty-cycle matched differential clock divider circuit, in accordance with the present disclosure.

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to a duty-cycle matched differential clock divider circuit. It should be noted that from the following discussion, alternative embodiments of the structures and methods disclosed herein will be readily recognized as viable alternatives that may be employed without departing from the principles of the embodiments. Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

High-speed circuit designs may use single-ended signaling. Circuits that use single-ended signaling, however, are susceptible to interference, crosstalk, reflection, and signal loss. This has prompted circuit designers to use differential signaling in high-speed circuits. Differential signaling uses two signals with equal amplitude and opposite polarity and relies on the crossing of the two signals to detect a logic state change. Some advantages of differential signaling include the ability to operate at lower voltages, high data rate, and ground noise immunity. In addition, generating differential frequency divided clock signals were achieved with single-ended division and re-generating pseudo-differential clocks at the output. This approach includes using a single-ended D-type flip flop frequency divider, transmission gate delay matching, and cross-coupled inverters to reduce skew. This approach, however, requires analog design effort and potential iteration with layout, as appropriate sizing of the transmission gate is required to ensure that the delay and edge rate are matched. Moreover, this approach may still result in some skew between the output clock signals due to the transmission gate and the inverter, despite the cross-coupling inverters used to minimize skew. In addition, the cross-coupled inventers may introduce duty-cycle distortion, which degrades performance of the clock path with respect to duty cycle. Degradation of duty cycle and skew can result in unwanted effects such as degraded noise rejection, reduced linearity performance of circuits, and reduced setup time margin of circuits running on differential clocks.

The disclosed circuit design outputs matched duty cycles for the logic high state and the logic low state of the output clock and reduces skew of the output clock signals with respect to the input clock signals. In an embodiment, the differential clock divider circuit is implemented using a primary and differential latch. The primary latch may be a single-ended latch, while the differential latch has a single-ended input, with a differential output. In other embodiments, the differential clock divider circuit is implemented using a first and second flip flop.

In addition to outputting matched duty cycles for the differential clock signals and reducing the skew of the output clock signals, the present frequency divider circuit design also consumes less power than alternative approaches. This is due to the absence of the cross-coupled inverters that may cause brief crowbar currents during clock transitions, which may be larger in the presence of input skew. The disclosed circuit design also is highly portable as it does not require the detailed sizing of analog devices and can be easily ported into new technology nodes with fewer design iterations, enabling a faster design and verification cycle for circuit designers. Furthermore, the disclosed circuit design may be scaled to higher frequency divisions, and may be used to generate differential divided clocks from a single-ended input clock signal.

FIG. 1 is a top-level circuit block diagram illustrating a first embodiment of a duty-cycle matched differential clock divider circuit 100, in accordance with the present disclosure. The differential clock divider circuit 100 may be configured to generate differential clock signals which have a frequency that is a fraction of the input clock frequency, the differential clock signals having matched duty cycles and reduced skew with respect to the input clock signals.

The differential clock divider circuit 100 may include a primary latch 110, a differential latch 120, and a plurality of inverters 130a, 130b, 130c (collectively referred to as 130). In the embodiment illustrated by FIG. 1, the primary latch 110 may be implemented as a D-type latch, which may include a data input terminal (e.g., D input), an enable terminal (e.g., denoted by EN), and a complementary enable terminal (e.g., denoted by $\overline{EN}$), and an output terminal (e.g., Q output). The primary latch 110 may be coupled to receive, through its D input, a feedback signal produced by the differential latch 120 and inverted by an inverter 130c. The EN terminal of the primary latch 110 may be coupled to receive a positive clock signal (e.g., CLK_P), while the $\overline{EN}$ terminal of the primary latch 110 may be coupled to receive a negative clock signal (e.g., CLK_M).

The differential latch 120 may be implemented as a differential D-type latch, which may include a data input inverter 122 and a modified D-type latch 124 (also referred to as modified latch 124). The modified latch 124 may include similar terminals as a D-type latch, with an additional complement input terminal (e.g., $\overline{D}$ input) and complement output terminal (e.g., $\overline{Q}$ output). The differential latch 120 may be coupled to receive the output of the primary latch 110 and may be configured to produce two complementary output signals. The D input terminal of the modified latch 124 may be coupled to the Q output of the primary latch 110. An input of the data input inverter 122 may be coupled to the Q output of the primary latch 110, producing an inverted signal of the output of the primary latch 110. The output of the data input inverter 122 may be coupled to the D input terminal of the modified latch 124. The EN and $\overline{EN}$ terminals of the modified latch 124 may receive the input clock signals CLK_M and CLK_P, respectively.

The input of an inverter 130a may be coupled to the Q terminal to receive the output signal of the modified latch 124. The inverter 130a inverts the Q output signal to produce the frequency divided positive clock signal (e.g., DIV_CLK_P). The input of an inverter 130b may be coupled to the $\overline{Q}$ output terminal to receive a complementary output signal of the modified latch 124, and produces the frequency divided negative clock signal (e.g., DIV_CLK_M). The inverter 130c may be coupled to receive the Q output signal of the modified latch 124, producing the feedback signal which is applied to the data terminal of the primary latch 110. In some embodiments, the differential clock divider circuit 100 may include an inverter 130d. The inverter 130d may be coupled to receive the DIV_CLK_M signal produced by inverter 130b, with the output left as an open connection to match the capacitive load of the Q and $\overline{Q}$ nets.

The input clock signals CLK_P and CLK_M may be generated by an oscillator and have the same frequency but opposite polarities. The input clock signals may be used as control signals to synchronize the operation of the primary latch 110 and the differential latch 120. The primary latch 110 may be a single-ended latch, configured to have a single ended input and a single ended output. The primary latch 110 may be configured to store and hold a logic level value, based in part on the input clock signals CLK_P and CLK_M and the feedback signal. For example, on a rising edge of CLK_M and a falling edge of CLK_P, the primary latch 110 may load a new logic level value into the latch. On a falling edge of CLK_M and a rising edge of CLK_P, the primary latch 110 may store the logic level value until the next clock edge.

The differential latch 120 may be configured to have a single-ended input and a differential output. The differential latch 120 may operate on the opposite phase of a clock cycle. The modified latch 124 of the differential latch 120 may be configured to store and hold a logic level value, based in part on the input clock signals and the input data signal. For example, while the primary latch 110 is tracking the state or logic value of feedback signal, the differential latch 120 may be storing a previous state or logic value. Similarly, while the primary latch 110 is storing a previous logic value of the feedback signal, the differential latch 120 may be loading a new logic value into the latch. As such, at every input clock period, the output clock will switch its state and produces the output clock signal at a frequency divided by two. The feedback loop causes the frequency divided clock signals DIV_CLK_P and DIV_CLK_M to toggle at half the frequency of the input clocks.

Figure 2:
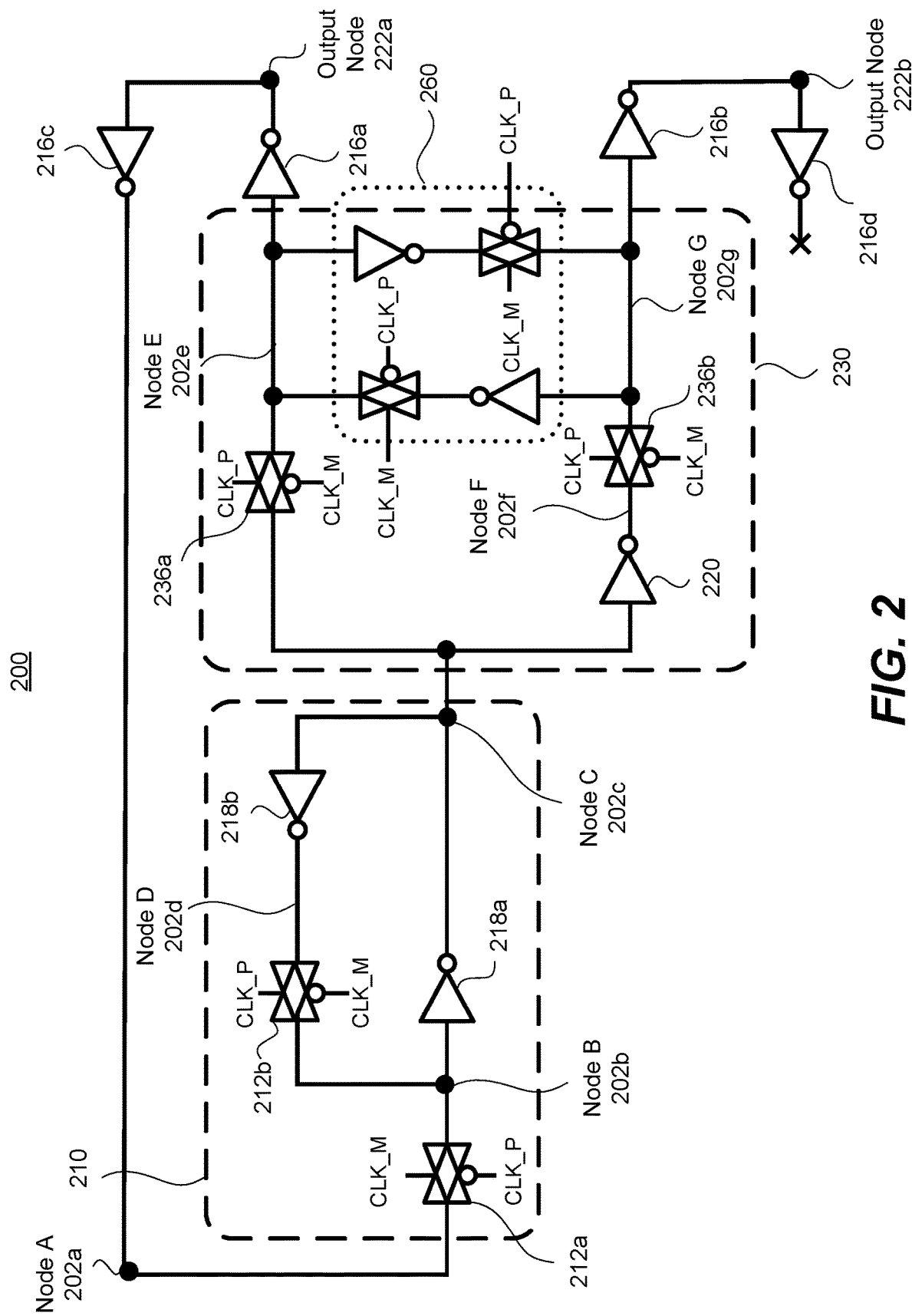
FIG. 2 is a logic gate circuit diagram illustrating the first embodiment of the duty-cycle matched differential clock divider circuit, in accordance with the present disclosure.

FIG. 2 is a logic gate circuit diagram illustrating the first embodiment of the duty-cycle matched differential clock divider circuit, in accordance with the present disclosure. As described in FIG. 1, the differential clock divider circuit 200 may include a primary latch 210 (an example circuit of the primary latch 110), a differential latch 230 (an example circuit of the differential latch 120), and a plurality of inverters (collectively referred to as 216). The input of the primary latch 210 may be coupled to receive a feedback signal generated by the differential latch 230. The output of the primary latch 210 may be coupled to the input of the differential latch 230. The differential latch 230 may be configured to produce two complementary output signals, Q and $\overline{Q}$. The input of an inverter 216a is coupled to receive the Q output signal from the differential latch 230, and the input of an inverter 216b is coupled to receive the $\overline{Q}$ output signal. The inverter 216a produces the frequency divided CLK_P signal (e.g., DIV_CLK_P), while the inverter 216b produces the frequency divided CLK_M signal (e.g., DIV_CLK_M). An inverter 216c receives the DIV_CLK_P signal and produces the feedback signal, which is applied to the input of the primary latch 210. In some embodiments, an inverter 216d may be coupled to receive the output of the inverter 216b, and the output of the inverter 216d may be left as an open connection for load balancing purposes.

As described in FIG. 1, the primary latch 210 may be implemented as a D-type latch. The primary latch 210 may receive three input signals, including a data signal (e.g., feedback signal from differential latch 230), an EN signal (e.g., CLK_P signal), and an $\overline{EN}$ signal (e.g., CLK_M signal), and may produce an output signal (e.g., Q) based in part on the state of the input signals. The primary latch 210 may be configured to store one bit of data, storing either a high or a low state. The primary latch 210 may be implemented using two transmission gates 212a, 212b, and two inverters 218a, 218b.

The input of transmission gate 212a may be coupled to receive the feedback signal from node A 202a, and the output of the transmission gate 212a may be coupled to node B 202b. The primary latch 210 may include a feedback loop including the inverters 218b and the transmission gate 212b. The input of the inverter 218a may be coupled to node B 202b and receives the output of the transmission gate 212a. The inverter 218a inverts the signal of the output of the transmission gate 212a, with the output of the inverter 218a coupled to node C 202c. The input of the inverter 218b may be coupled to node C 202c and receives an output of the inverter 218a. The input of the transmission gate 212b is coupled to node D 202d, while the output is coupled to node B 202b, hence forming the feedback loop.

A transmission gate may be configured to pass an input signal based in part on the value of a control signal and a complementary control signal. The transmission gate may include a first path and a second path in parallel, the first path including an n-type transistor, and the second path including a p-type transistor. The control signals are applied to the gate terminal of the transistors to control the outputs of the n-type transistor and the p-type transistor. The input clock signals may be used as control signals to the transmission gate. In the embodiment illustrated by FIG. 2, the input clock signals CLK_P and CLK_M may be used as control signals to the transmission gate to determine when the logic value at node A 202a is passed to node B 202b. Both transistors of the transmission gate 212a are coupled to receive the inverted feedback signal from node A 202a. CLK_P may be coupled to the gate terminal of the p-type transistor, while CLK_M may be coupled to the gate terminal of the n-type transistor. As such, the value at node A 202a is passed to node B 202b when CLK_M is high and CLK_P is low.

As an example, at a starting state, the input clock signals CLK_P is at a logic low and CLK_M at a logic high, the transmission gate 212a is in an ON state as the gates of the transistors are enabled by the input clock signals. As such, the transmission gate 212a connects node A and node B, allowing the logic state of node B to follow the logic state of node A, and for the logic state of node C to be a logically inverted state of node B. Similarly, CLK_P and CLK_M signals are used as control signals to the transmission gate 212b. The CLK_P signal is applied to the gate terminal of the n-type transistor, while CLK_M is fed to the gate terminal of the p-type transistor. With the input clock signals CLK_P is at a logic low and CLK_M at a logic high, the transmission gate 212b is in an OFF state as the gates of the transistors are disabled by the input clock signals. As such, the transmission gate 212b disconnects node D 202d from node B 202b. At a next clock transition with the rising edge of the CLK_P and falling edge of CLK_M, the states of the transmission gate 212a and the transmission gate 212b may switch. Node A 202a may be disconnected from node B 202b, while node B 202b may be connected to node D 202d. The feedback loop within the primary latch 210 may store the current state of node B 202b, node C 202c, and node D 202d for the duration of time that CLK_P is at a logic high, and CLK_M is at a logic low.

The differential latch 230 may be configured to generate the differential frequency divided clock signals (e.g., DIV_CLK_P, DIV_CLK_M). The differential latch 230 may include feed-forward transmission gates 236a, 236b, a data input inverter 220, and a set of two transmission gate and inverter pairs in block 260. Node C 202c may be split into parallel branches, which includes a lower branch and an upper branch. The input of the first feed-forward transmission gate 236a is coupled to the upper branch stemming from node C 202c and the output is coupled to node E 202e. The input of the data input inverter 220 is coupled to the lower branch and the output of the data input inverter 220 is coupled to node F 202f. The input of the feed-forward transmission gate 236b is coupled to node F 202f and the output is coupled to node G 202g. The cross-coupled transmission gate and inverter pairs in block 260 are coupled to node E 202e and node G 202g and connects the upper and lower branches. The cross-coupled pairs are configured to function as a feedback loop which may store a logic state of the output until the next rising edge of CLK_P and falling edge of CLK_M. The input of an inverter 216a may be coupled to node E 202e, while the input of an inverter 216b may be coupled to node G 202g. The inverter 216a generates the frequency divided positive clock signal (e.g., DIV_CLK_P) and the inverter 216b generates the frequency divided negative clock signal (e.g., DIV_CLK_M).

The CLK_P signal is applied to the gate terminal of the n-type transistor of the first feed-forward transmission gate 236a while the CLK_M signal is applied to the gate terminal of the p-type transistor of the first feed-forward transmission gate 236a. The n-type transistor and the p-type transistor of the feed-forward transmission gate 236b is similarly connected. As an example, on a rising edge of CLK_P and a falling edge of CLK_M, the primary latch 210 stores the state of the circuit, which propagate through the enabled feed-forward transmission gates on the upper and lower branches of the differential latch to node E 202e and node G 202g. The two cross-coupled transmission gates and inverter pairs in block 260 are disabled. The signals at node E 202e and node G 202g are inverted to produce the DIV_CLK_P and DIV_CLK_M signals at output node 222a and output node 222b. The signal at output node 222a may be inverted to produce the feedback signal at node A 202a. The logic level at node A 202a may not change until the clock edge transitions to a falling edge of CLK_P and a rising edge of CLK_M and the primary latch will load new input into the feedback loop. On a falling edge of CLK_P and a rising edge of CLK_M, the primary latch 210 will load the inverted feedback signal at node A, and the differential latch 230 will switch logic states, for example, the feed-forward transmission gates 236a, 236b transition to an OFF state, and the transmission gates in block 206 transition to an ON state, which holds the output state of the clock divider circuit.

Figure 3:
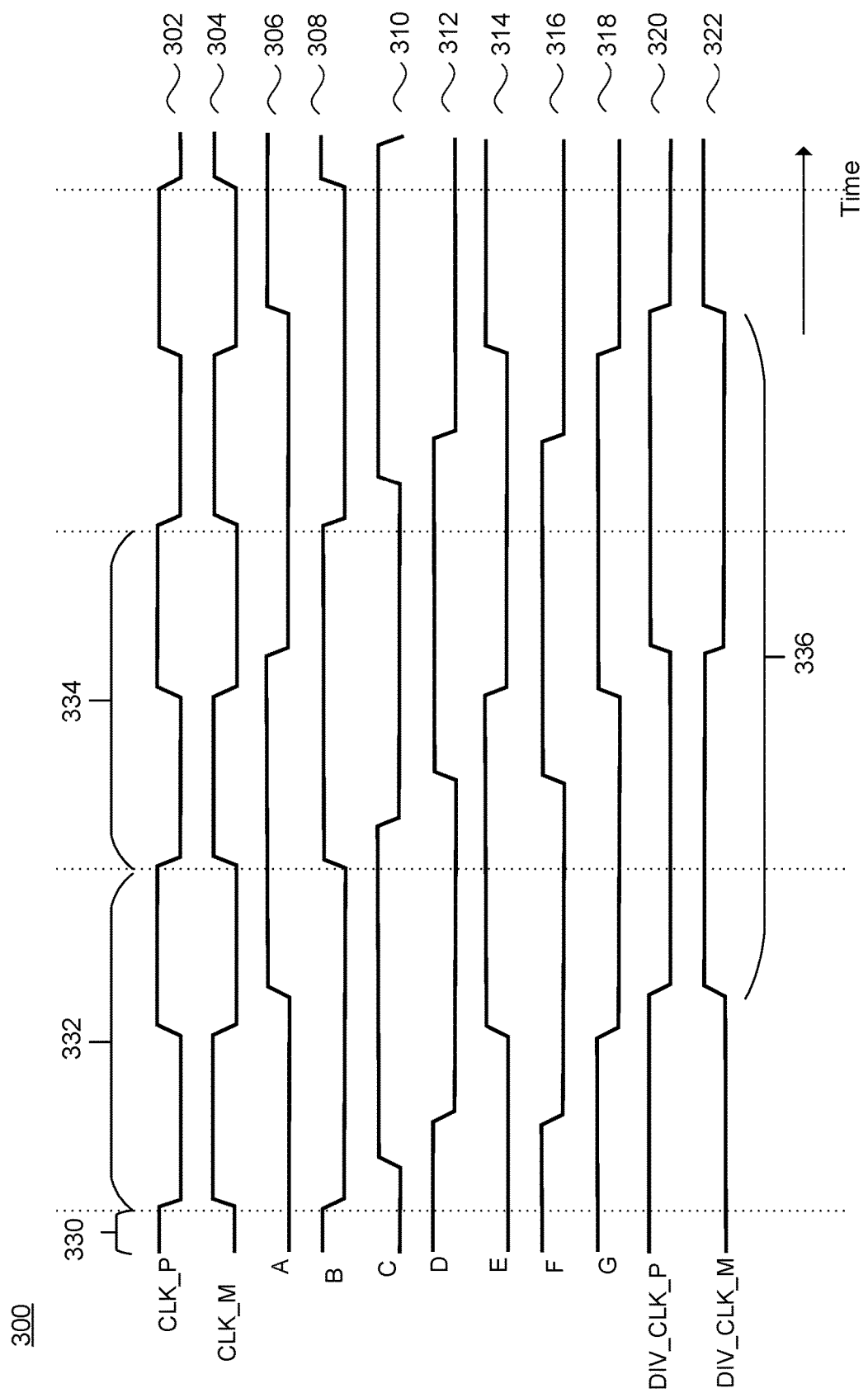
FIG. 3 is a timing diagram illustrating the clock frequency signals corresponding to the first embodiment of the duty-cycle matched differential clock divider circuit, in accordance with an embodiment.

FIG. 3 is a logic waveform diagram illustrating the output clock frequency signals corresponding to the first embodiment of the duty-cycle matched differential clock divider circuit, in accordance with an embodiment.

The logic signals and waveforms shown in the FIG. 3 are illustrated of a voltage signal represented by a logic high of value "1" or a logic low of a value "0". A logic signal represented by a logic "1" may have a high voltage of, for example, 2.5 volts, while a logic signal represented by a logic "0" may have a low voltage of, for example, 0 volts. In addition, it is noted that the transitions illustrated between logic lows and logic highs (and vice versa) in FIG. 2 are exaggerated as the slopes are for illustration purposes only, and that such transitions may be substantially vertical depending on a time differential between logic low and logic high transitions.

As illustrated by FIG. 3, at an initial time period 330, CLK_P 302 is initialized to a logic high, while CLK_M 304 is initialized to a logic low. As such, the transmission gate 212a is in an OFF state, while the transmission gate 212b is in an ON state. On a falling edge of CLK_P 302 and a rising edge of CLK_M 304 at the start of a first clock cycle 332, the transmission gate 212a transitions from the OFF state to an ON state, while the transmission gate 212b transitions from the ON state to an OFF state. The transmission gate 212a passes the logic low value at node A 306 to node B 308, the inverter 216a producing an inverted signal of a logic high value at node C 310. The inverter 216b inverts the logic high signal at node C 310 and outputs a logic low signal to node D 312. As transmission gate 212b is in an OFF state, the signal at node D 312 is blocked from propagating to node B 308. The signal at node C 310 propagates to the input of the feed-forward transmission gate 236a and the input of the inverter 216c. The inverter 216c inverts the logic high signal at node C 310 and produces a logic low signal at node F 316. As the feed-forward transmission gates 236 are in an OFF state, the feed-forward transmission gates block the signal at node C 310 and node F 316 from propagating to node E 314 and node G 318 respectively. Node E 314 may be initiated to a logic low, while node G 318 may be initiated to a logic high. The two cross-coupled transmission gates and inverter pairs in block 260 are enabled, and may store the logic levels at node E 314 and node G 318 for a duration up to the next rising edge of CLK_P 302 and the next falling edge of CLK_M 304, during which the feed-forward transmission gates 236 are enabled to load a new value to be stored by the two cross-coupled pairs.

On a rising edge of CLK_P 302 and a falling edge of CLK_M 304 during the first clock cycle 332, the transmission gate 212a transitions to an OFF state, while transmission gate 212b transitions to an ON state. As such, the feedback loop in the primary latch 210 may store the logic high signal at node D for a duration up to a next rising edge of CLK_M 304 and a falling edge of CLK_P 302, which may enable the transmission gate 212a and cause the primary latch 210 to load a subsequent logic value to the feedback loop from node A 306. The feed-forward transmission gates 236 transition to an ON state. The feed-forward transmission gate 236a passes the logic high signal at node C 310 to node E 314, and the feed-forward transmission gate 236b passes the logic low signal at node F 316 to node G 318. The two cross-coupled transmission gates and inverter pairs in block 260 are disabled. The inverter 216d on the upper branch receives the logic high signal at node E 314 as input and inverts the signal to produce the logic low DIV_CLK_P signal 320 at node 222a. The inverter 216b on the lower branch receives the logic low signal at node G 318 as input and inverts the signal to produce the logic high DIV_CLK_M signal 322 at node 222b. The inverter 216c inverts the DIV_CLK_P signal 320 and produces a logic high feedback signal to node A 306 and applied back to the input of the primary latch 210. The logic levels DIV_CLK_M signal 322 at node 222b and DIV_CLK_P signal 320 at node 222a may be stored for a duration up to a next rising edge of CLK_P 302 and a falling edge of CLK_M 304, when the feed-forward transmission gates 236 transition from an OFF state to an ON state to load a new logic value to be stored by the differential latch 230. As such, the frequency of the output clock signals is halved, and a clock cycle 336 of the output clock signals is double that of the input clock signals.

A similar process occurs for the subsequent clock cycles 334 of the input clock signals CLK_P 302 and CLK_M 304. In some embodiments, some delay may be observed in the feedback loop, for example, the duration of time for observing a change in logic level at node D as a result of a change in logic level observed at node C. However, the feed-forward transmission gates 236 are in an OFF state, disconnecting node E and node G from node C and node F respectively for a duration up to the next rising edge of CLK_M 304 and a falling edge of CLK_P 302. This allows for node C and node F to be charged up or discharged to a logic level, thus preventing any delay caused in the primary latch from being observed in the output frequency divided clock signals. In addition, the path of the output signal from the feed-forward transmission gate 236a to the output node 222a and the path of the output signal from the feed-forward transmission gate 236b to the output node 222b may be identical. Hence, reducing the skew between the DIV_CLK_P 320 and DIV_CLK_M 322 output signals at the output nodes.

Figure 4:
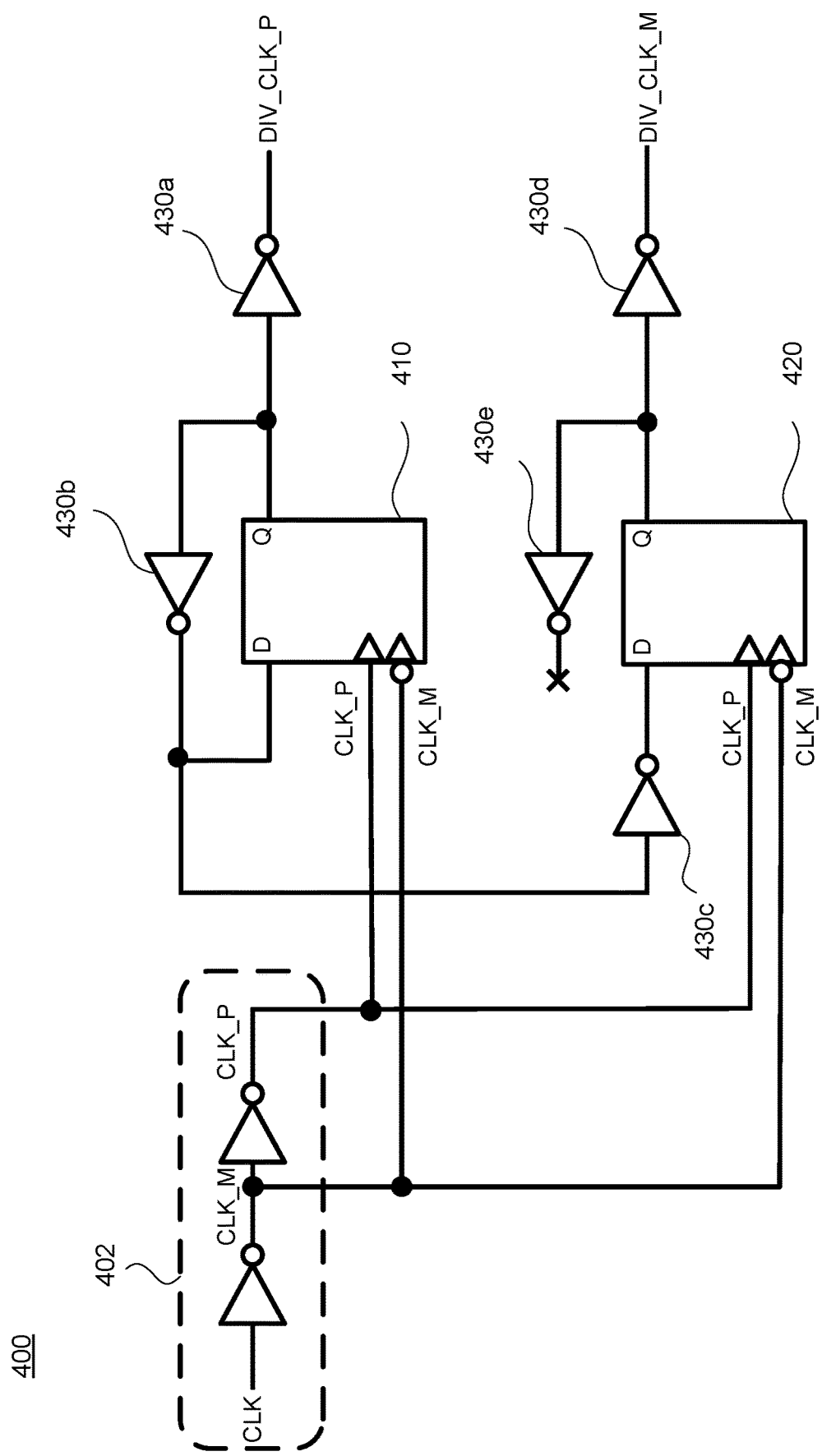
FIG. 4 is a top-level circuit block diagram illustrating a second embodiment of a duty-cycle matched differential clock divider circuit, in accordance with the present disclosure.

FIG. 4 is a top-level circuit block diagram illustrating a second embodiment of a duty-cycle matched differential clock divider circuit, in accordance with the present disclosure. The second embodiment of the duty-cycle matched differential clock divider circuit may include a first D-type flip flop 410, a second D-type flip flop 420, and a plurality of inverters 430a, 430b, 430c, 430d, 430e (collectively referred to as 430). A D-type flip flop may include a data input terminal (e.g., D input), a clock terminal, and a complementary clock terminal, and an output terminal (e.g., Q output). The data input terminal of the first flip flop 410 may be coupled to receive a feedback signal, while the clock terminal is coupled to receive the CLK_P signal, and the complementary clock terminal is coupled to receive the CLK_M signal.

The first D flip flop may be configured to function as a single-ended frequency divider circuit. The output of the first D flip flop is coupled to the input of an inverter 430a, which produces the frequency divided positive clock signal (e.g., DIV_CLK_P). The output of the first D flip flop is further coupled to the input of an inverter 430b, which produces the feedback signal. The feedback signal may be applied back to the data input terminal of the first flip flop 410 in a feedback loop, which may cause the output DIV_CLK_P signal to toggle with half the frequency of the input clock signals.

To achieve a differential clock divider circuit, the second D flip flop may be coupled to the first D flip flop. The input of an inverter 430c is coupled to the output of the inverter 430b, and the output of the inverter 430c is coupled to the data input terminal of the second flip flop 420. The inverter 430c inverts the feedback signal to achieve the opposite polarity and passes the inverted signal to the second flip flop 420. The EN and EN terminals of the D flip flop may be coupled to receive the CLK_P and CLK_M signals respectively. The output of the second flip flop 420 is coupled to the input of an inverter 430d, the inverter 430d producing the frequency divided negative clock signal (e.g., DIV_CLK_M). In some embodiments, an inverter 430e may be coupled to receive the output of the second flip flop 420, and the output of the inverter 430e may be left as an open connection to match the capacitive load of the Q and Q nets.

As both the first flip flop 410 and the second flip flop 420 are controlled by the same CLK_P and CLK_M signals, the state of both flip flops transition on a rising edge of CLK_P and a falling edge of CLK_M. As such, the skew of the two clocks produced at the output of the first and second flip flops can be reduced with respect to the input clock signals without the use of cross-coupled inverters. Hence, due to the absence of cross-coupled inverters, degradation in duty cycle of the circuit is reduced. While the clock divider circuit is implemented with D-type flip flops in FIG. 4, in other embodiments, other types of flip flops that are edge-triggered may be used. For example, other types of flip flops may include T-type flip flops, JK flip flops, SR flip flops, or a combination thereof. While the embodiment illustrated by FIG. 4 is configured to divide an input clock signal by two, in other embodiments, the frequency divider circuit may be scaled to perform higher divisions. For example, the frequency divider circuit may be configured to divide the frequency of the input clock signal by a multiple of two. A frequency divider circuit scaled to perform higher divisions is further described in FIG. 5. In some embodiments, the frequency divider circuit may be configured to perform divisions by an odd number.

In some embodiments, an input clock signal generator circuit 402 may be used to generate the complementary input clock signals CLK_M and CLK_P to drive the first and second flip flop. The input clock signal generator circuit may include two inverters, the input of a first inverter may be coupled to receive a main clock signal, which may be generated by an oscillator. The first inverter inverts the main clock signal to generate CLK_M. A second inverter inverts the output of the first inverter, CLK_M, and produces the CLK_P signal. This approach may reduce skew between the complementary input clock signals.

Figure 5:
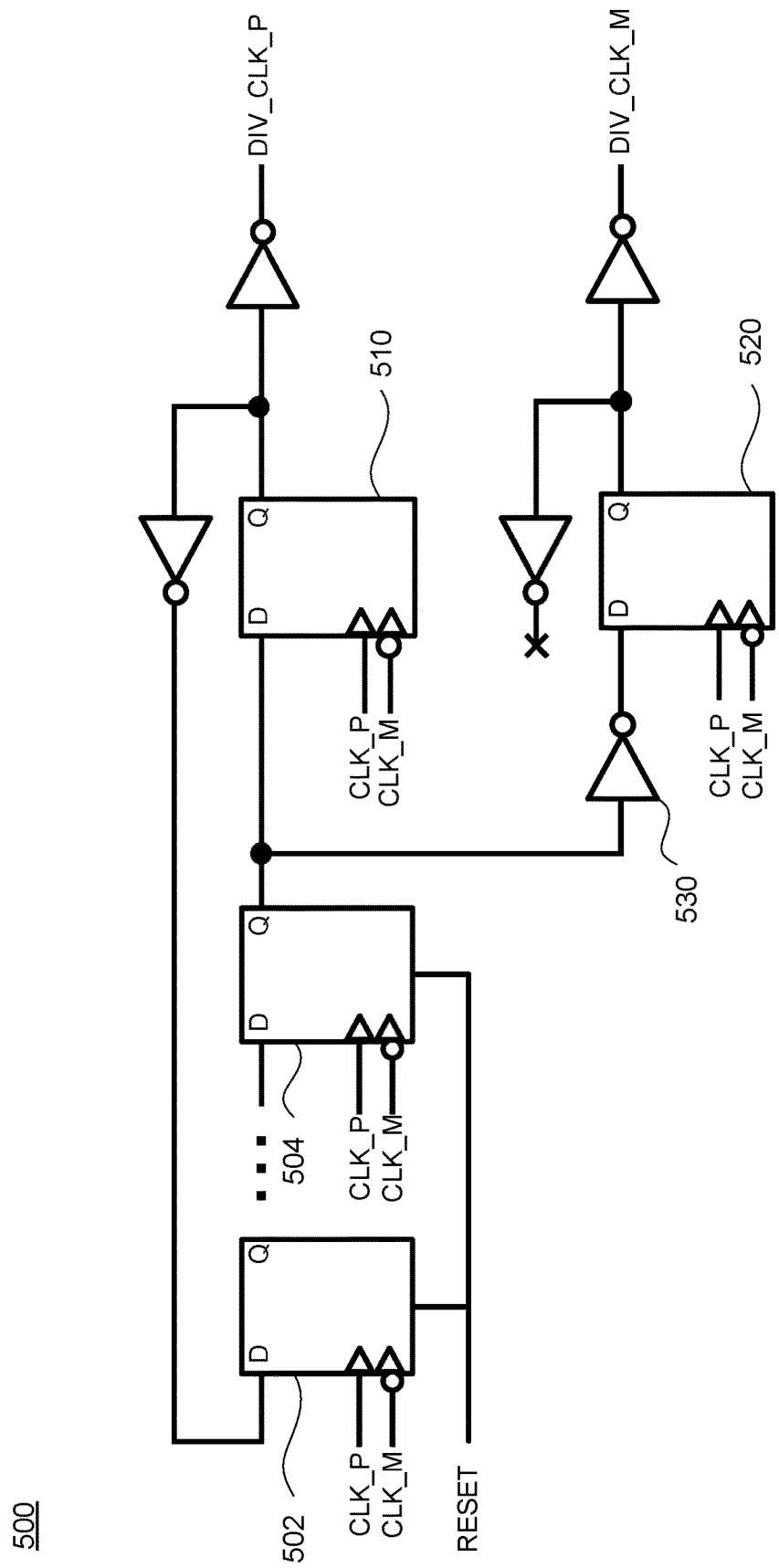
FIG. 5 is a top-level circuit block diagram illustrating a third embodiment of a duty-cycle matched differential clock divider circuit, in accordance with the present disclosure.

FIG. 5 is a top-level circuit block diagram illustrating a third embodiment of a duty-cycle matched differential clock divider circuit 500, in accordance with the present disclosure. The differential clock divider circuit 500 may be scaled to perform higher divisions. As illustrated in FIG. 5, additional flip flops may be cascaded in a chain and coupled to the clock divider circuit. For example, a starting flip flop 502 is coupled to receive the feedback signal, while the output of the starting flip flop 502 is coupled to the input of the proceeding flip flop in the chain. The input of each intermediate flip flop in the chain is coupled to the output of a preceding flip flop, and the output of each intermediate flip flop is coupled to the input of a proceeding flip flop. The output of the last flip flop 504 (e.g., $n^{th}$ flip flop) in the chain is coupled to the input of a first flip flop 510 and the input of an inverter 530. Each flip flop in the chain may divide the frequency of an input clock signal by two, as such, a division factor may be defined as $2^n$, where n is the number of flip flops in the chain. For example, to achieve a desired output clock frequency, a circuit designer may determine a division factor, the division factor used to determine a number of components (e.g., latches or flip flops) required for a differential clock divider circuit. For example, if a desired output frequency is a quarter of the input clock frequency, a circuit designer may choose to add an additional flip flop or latch to the circuit design. Note that the flip-flops between the starting flip flop 502 and the last flip flop 504 contain a reset signal (RST). This reset signal causes all flip-flops to start-up in the same state when the circuit is powered on. This ensures correct operation as a frequency divider since the logic inversion will only happen to the signal once per loop through the flip-flops.

Figure 6:
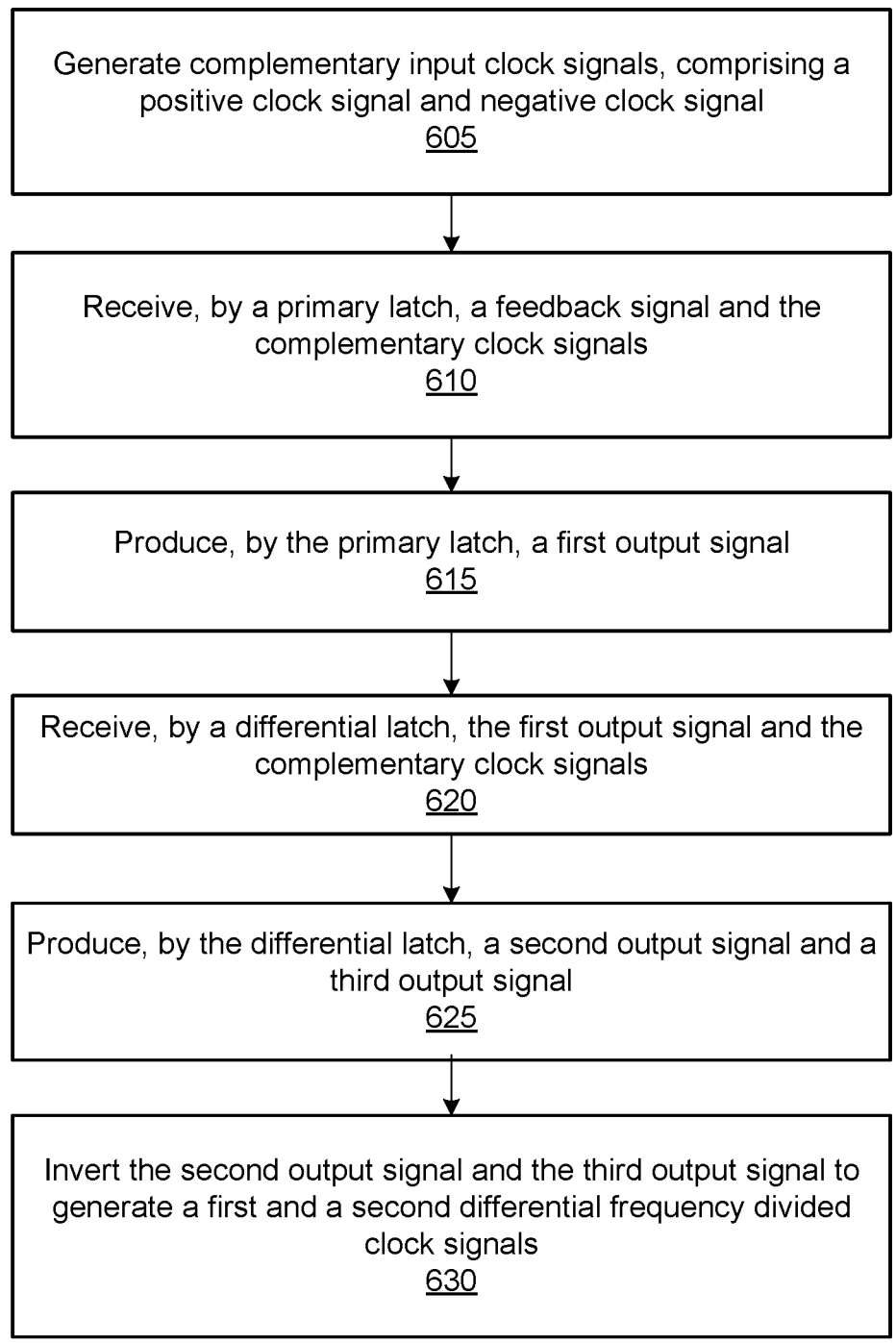
FIG. 6 is a flow chart depicting a process duty-cycle matched differential clock divider circuit, in accordance with the present disclosure.

FIG. 6 is a flow chart depicting a process for generating differential divided clock signals, in accordance with the present disclosure. In some embodiments, the process 600 may be performed by a differential clock divider circuit 100. In other embodiments, the process 600 may be performed by a differential clock divider circuit implemented on a computer system. In addition, some embodiments may perform the steps of FIG. 6 in parallel, may perform the operations in different orders, or may perform different operations altogether.

The differential clock divider circuit may generate complementary input clock signals, including a positive clock signal and a negative clock signal at 610. The differential clock divider circuit may use an input clock signal generator circuit to generate the complementary input clock signals with minimum skew. As described in FIG. 4, the input clock signal generator circuit may include two inverters, the input of a first inverter may be coupled to receive a main clock signal, which may be generated by an oscillator. The first inverter inverts the main clock signal to generate CLK_M. A second inverter inverts the output of the first inverter, CLK_M, and produces the CLK_P signal.

The differential clock divider circuit may receive, by a primary latch, a feedback signal and the complementary clock signals at 610. The complementary clock signals may control the state of latches or flip flops in the differential clock divider circuit. The primarty latch may include a feedback loop which may store a bit of data. The primary latch may load a bit of data or store a bit of data, based on the state of the complementary clock signals. The differential clock divider circuit may produce, by the primary latch, a first output signal at 615. The primary latch may produce an output signal based in part on the state of the stored bit of data, and the state of the complementary clock signals. The primary latch may be a single-ended latch.

The differential clock divider circuit may receive, by a differential latch, the first output signal and the complementary clock signals at 620. The differential latch may include a set of two cross-coupled transmission gate and inverter pairs that may store a bit of data. The differential latch may load a bit of data or store a bit of data, based on the state of the complementary clock signals. The differential clock divider circuit may produce, by the differential latch, a second output signal and a third output signal at 625. The differential latch may produce an output signal based in part on the state of the stored bit of data, and the state of the complementary clock signals. The second output signal may be inverted to produce the feedback signal which may be provided back to the primary latch. The differential clock divider circuit may invert the second output signal and the third output signal to generate a first and a second differential frequency divided clock signals at 630.

It is noted that the circuit design configurations may be structured as computer program code within an electronic design system and placed within a circuit design of a chip described through an electronic design system, e.g., through a netlist. Further, the circuit design configuration described may be structured as computer program code that is stored in a library (e.g., intellectual property (or IP) blocks) of an electronic design automation system for retrieval and use in a circuit design process.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of ordinary skill in the art will appreciate still additional alternative structural and functional designs through the disclosed principles of the embodiments. Thus, while particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

What is claimed is:

1. A differential clock frequency divider circuit, comprising:
 a primary latch including a single data input terminal and a single data output terminal, the primary latch coupled to receive a feedback signal at the single data input terminal and complementary input clock signals, the primary latch producing a first output signal at the single data output terminal;
 a differential latch, coupled to receive the first output signal produced by the primary latch and the complementary input clock signals, the differential latch producing a second output signal and a third output signal; and a first inverter, coupled to receive the second output signal, the first inverter producing the feedback signal applied to the single data input terminal of the primary latch.

2. The differential clock frequency divider circuit of claim 1, further comprising:
a second inverter, coupled to receive the second output signal from the differential latch, the second inverter producing a first differential frequency divided clock signal.

3. The differential clock frequency divider circuit of claim 1, further comprising:
a third inverter, coupled to receive the third output signal from the differential latch, the third inverter producing a second differential frequency divided clock signal.

4. The differential clock frequency divider circuit of claim 1, wherein the primary latch is a single-ended D-type latch.

5. The differential clock frequency divider circuit of claim 1, wherein the primary latch comprises:
a first transmission gate, coupled to receive the feedback signal and the complementary input clock signals, wherein a state of the first transmission gate is determined by logic level values of the complementary input clock signals; and
a feedback loop, comprising:
a fourth inverter, coupled to receive an output of the first transmission gate, the fourth inverter producing the first output signal;
a fifth inverter, coupled to receive the first output signal, the fifth inverter producing an inverted first output signal, and
a second transmission gate, coupled to receive the inverted first output signal, and an output of the second transmission gate coupled to the output of the first transmission gate and an input of the fourth inverter.

6. The differential clock frequency divider circuit of claim 5, the feedback loop is configured to store a logic level value.

7. The differential clock frequency divider circuit of claim 5, wherein the first transmission gate and the second transmission gate are enabled on opposite phases of a clock cycle corresponding to the complementary input clock signals.

8. The differential clock frequency divider circuit of claim 1, wherein the differential latch comprises:
a sixth inverter, coupled to receive the first output signal, the sixth inverter producing a fourth output signal;
a first feed-forward transmission gate, coupled to receive the fourth output signal produced by the sixth inverter;
a second feed-forward transmission gate, coupled to receive the first output signal produced by the primary latch; and
a set of two transmission gate and inverter pairs configured to store a logic level value, comprising a first transmission gate and inverter pair and a second transmission gate and inverter pair, wherein each pair comprises a transmission gate coupled to receive an output of an inverter of each pair.

9. The differential clock frequency divider circuit of claim 8, wherein an input of the first transmission gate and inverter pair, an output of the second transmission gate and inverter pair, and an output of the first feed-forward transmission gate are coupled to a first node.

10. The differential clock frequency divider circuit of claim 8, wherein an output of the second feed-forward transmission gate, an output of the first transmission gate and inverter pair, and an input of the second transmission gate and inverter pair are coupled to a second node.

11. The differential clock frequency divider circuit of claim 9, further comprising:
a second inverter, coupled to receive the second output signal from the differential latch, the second inverter producing a first differential frequency divided clock signal; and
a third inverter, coupled to receive the third output signal from the differential latch, the third inverter producing a second differential frequency divided clock signal,
wherein an input of the third inverter is coupled to the first node, and an input of the second inverter is coupled to a second node.

12. A method for generating differential frequency divided clock signals, the method comprising:
generating complementary input clock signals, comprising a positive clock signal and a negative clock signal;
receiving, by a primary latch including a single data input terminal and a single data output terminal, a feedback signal at the single data input terminal and the complementary input clock signals;
producing, by the primary latch, a first output signal at the single data output terminal;
receiving, by a differential latch, the first output signal and the complementary input clock signals;
producing, by the differential latch, a second output signal and a third output signal;
inverting the second output signal to produce the feedback signal applied to the single data input terminal of the primary latch; and
inverting the second output signal and the third output signal to generate differential frequency divided clock signals.

* * * * *